(12) United States Patent
Samuel et al.

(10) Patent No.: US 10,570,703 B2
(45) Date of Patent: Feb. 25, 2020

(54) ESTIMATION AND MONITORING OF CASING WEAR DURING A DRILLING OPERATION USING CASING WEAR MAPS

(71) Applicant: LANDMARK GRAPHICS CORPORATION, Houston, TX (US)

(72) Inventors: Robello Samuel, Cypress, TX (US); Aniket Aniket, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 728 days.

(21) Appl. No.: 15/109,408

(22) PCT Filed: Dec. 31, 2014

(86) PCT No.: PCT/US2014/073055
§ 371 (c)(1),
(2) Date: Jun. 30, 2016

(87) PCT Pub. No.: WO2015/130406
PCT Pub. Date: Sep. 3, 2015

(65) Prior Publication Data
US 2016/0326844 A1    Nov. 10, 2016

Related U.S. Application Data

(60) Provisional application No. 61/946,534, filed on Feb. 28, 2014.

(51) Int. Cl.
*G06G 7/48* (2006.01)
*E21B 41/00* (2006.01)
(Continued)

(52) U.S. Cl.
CPC ............ *E21B 41/0092* (2013.01); *E21B 3/00* (2013.01); *E21B 12/02* (2013.01); *E21B 47/0006* (2013.01); *G06F 17/5009* (2013.01)

(58) Field of Classification Search
None
See application file for complete search history.

(56) References Cited

U.S. PATENT DOCUMENTS

| 8,542,127 B1 | 9/2013 | Goroshevskiy et al. |
| 2009/0119076 A1 | 5/2009 | Madatov et al. |

(Continued)

FOREIGN PATENT DOCUMENTS

| WO | WO-2005091196 A1 | 9/2005 |
| WO | WO-2014209282 A1 | 12/2014 |
| WO | WO-2015047406 A1 | 4/2015 |

OTHER PUBLICATIONS

Ripman Casing Wear in Multilateral Wells University of Stavanger, 2011 (Year: 2011).*

(Continued)

*Primary Examiner* — Rehana Perveen
*Assistant Examiner* — Cuong V Luu

(57) ABSTRACT

System and methods for monitoring casing wear for a well during a drilling operation are provided. Casing design parameters for a planned well are determined during a planning phase of the drilling operation. A wear factor along a length of the planned well is computed based on the casing design parameters. A casing wear map is generated based on the computed wear factor along the length of the planned well relative to one or more of the casing design parameters. The generated casing wear map is visualized via a display of a computing device. The visualized casing wear map enables a user of the computing device to estimate casing wear for the planned well and determine an appropriate casing design for the planned well based on the estimated casing wear.

20 Claims, 7 Drawing Sheets

(51) Int. Cl.
  *E21B 12/02*   (2006.01)
  *E21B 3/00*    (2006.01)
  *E21B 47/00*   (2012.01)
  *G06F 17/50*   (2006.01)

(56) References Cited

U.S. PATENT DOCUMENTS

| | | | |
|---|---|---|---|
| 2009/0308616 A1 | 12/2009 | Wylie et al. | |
| 2010/0030491 A1 | 2/2010 | Ziegel et al. | |
| 2010/0037675 A1* | 2/2010 | Hannahs | E21B 17/1085 73/7 |
| 2011/0036439 A1* | 2/2011 | Fernald | G01F 1/662 138/104 |
| 2011/0056298 A1 | 3/2011 | O'Keefe et al. | |
| 2012/0080197 A1 | 4/2012 | Dickens et al. | |
| 2015/0337599 A1* | 11/2015 | Bullock | E21B 33/085 175/24 |
| 2016/0230528 A1* | 8/2016 | Samuel | E21B 12/02 |

OTHER PUBLICATIONS

Mitchell Improving Casing Wear Prediction and Mitigation Using a Statistically Based Model Drilling Conference and Exhibition, 2012 (Year: 2012).*

Petra Seitinger Casing Wear Analysis Mining University of Leoben (Year: 2010).*

International Search Report and Written Opinion, dated Apr. 15, 2015, 13 pages, Korean Intellectual Property Office.

European Patent Office, Supplementary European Search Report, dated Jun. 7, 2017, 5 pages, Europe.

Canadian Intellectual Property Office, Application 2938028, Second Examiner's Letter, Apr. 3, 2018, 5 pages, Canada.

Gao Dei, Sun Lianzhong and Liang Jihong, Prediction of casing wear in extended-research drilling, China University of Petroleum, Nov. 10, 2010, 8 pages, Beijing China.

Australian Government IP Australia, Patent Examination Report No. 1, dated Nov. 1, 2016, 8 pages, Australia.

Aniket Kumar, Joseph Nwachukwu and Robello Samuel, Analytical Model to Estimate the Downhole Casing Wear Using the Total Wellbore Energy, Dec. 2013, 8 pages, Vo. 135, Journal of Energy Resources Technology.

Sarah Mitchell and Yanghua Xiang, Improving Casing Wear Prediction and Mitigation Using a Statistically Based Model, Mar. 6-8, 2012, 15 pages, IADC/SPE 151448, IADC/SPE Drilling Conference and Exhibition, San Diego, California, USA.

Hall, R., Casing Wear Series—14: Interpreting and Applying CWPRO Results, Pegasus Vertex, Inc.—Blog, published on Oct. 16, 2012, [retrieved from internet on Jan. 30, 2017], http://www.pvisoftware.com/blog/casing-wear-series-14-interpreting-and-applying-cwpro-results/.

Canadian Intellectual Property Office, Application No. 3,005,858, Third Examiner's Letter, dated Mar. 26, 2019, 7 pages, Canada.

* cited by examiner

ESTIMATION AND MONITORING OF CASING WEAR DURING A DRILLING OPERATION USING CASING WEAR MAPS

CROSS-REFERENCE TO RELATED APPLICATIONS

The present application is a U.S. National Stage patent application of International Patent Application No. PCT/US2014/073055, filed on Dec. 31, 2014, which claims the benefit of U.S. Provisional Patent Application No. 61/946,534, filed on Feb. 28, 2014, titled "Casing Wear Maps: Visualization and Interpretation Method to Estimate and Monitor Casing Wear," the benefit of both of which are claimed and the disclosure of both of which are incorporated herein by reference in their entirety.

FIELD OF THE DISCLOSURE

The present disclosure relates generally to the field of drilling applications for hydrocarbon recovery, and more particularly, to applications for estimating and monitoring casing wear for a well during drilling operations.

BACKGROUND

In the exploration and recovery of subsurface hydrocarbon deposits, a borehole or wellbore is typically drilled into a reservoir rock formation using a rotatable drill bit that is attached to a bottom hole assembly at the end of a drill string. Once the wellbore is drilled to a desired depth, one or more large diameter metal pipes or tubes (referred to as casing) are set inside the drilled well to aid in the drilling process. The casing forms a major structural component of the wellbore and serves several important functions including, but not limited to, preventing the formation wall from caving into the wellbore, isolating different formation zones to prevent the flow or cross-flow of formation fluid, and providing a means for maintaining control of formation fluids and pressure as the well is drilled. Therefore, an appropriate casing design for a planned well must account for the expected casing wear in order to mitigate the chances of a costly failure in the casing during drilling and/or production.

However, it is generally difficult to predict the actual amount of casing wear that may be expected during a drilling operation. Thus, it is important to have a reliable technique for analyzing the causes and effects of casing wear during both the planning and real-time operating phases of the drilling operation. Conventional casing wear analysis techniques are available for predicting the locations of severe casing wear, e.g., based on data indicating the parts of a drill string known to cause high side forces. However, such conventional techniques often fail to provide an effective way to quickly analyze the effects of all the different parameters that affect casing wear over the course of the drilling operation.

BRIEF DESCRIPTION OF THE DRAWINGS

Illustrative embodiments of the present disclosure are described in detail below with reference to the attached drawing figures.

Figure 1:
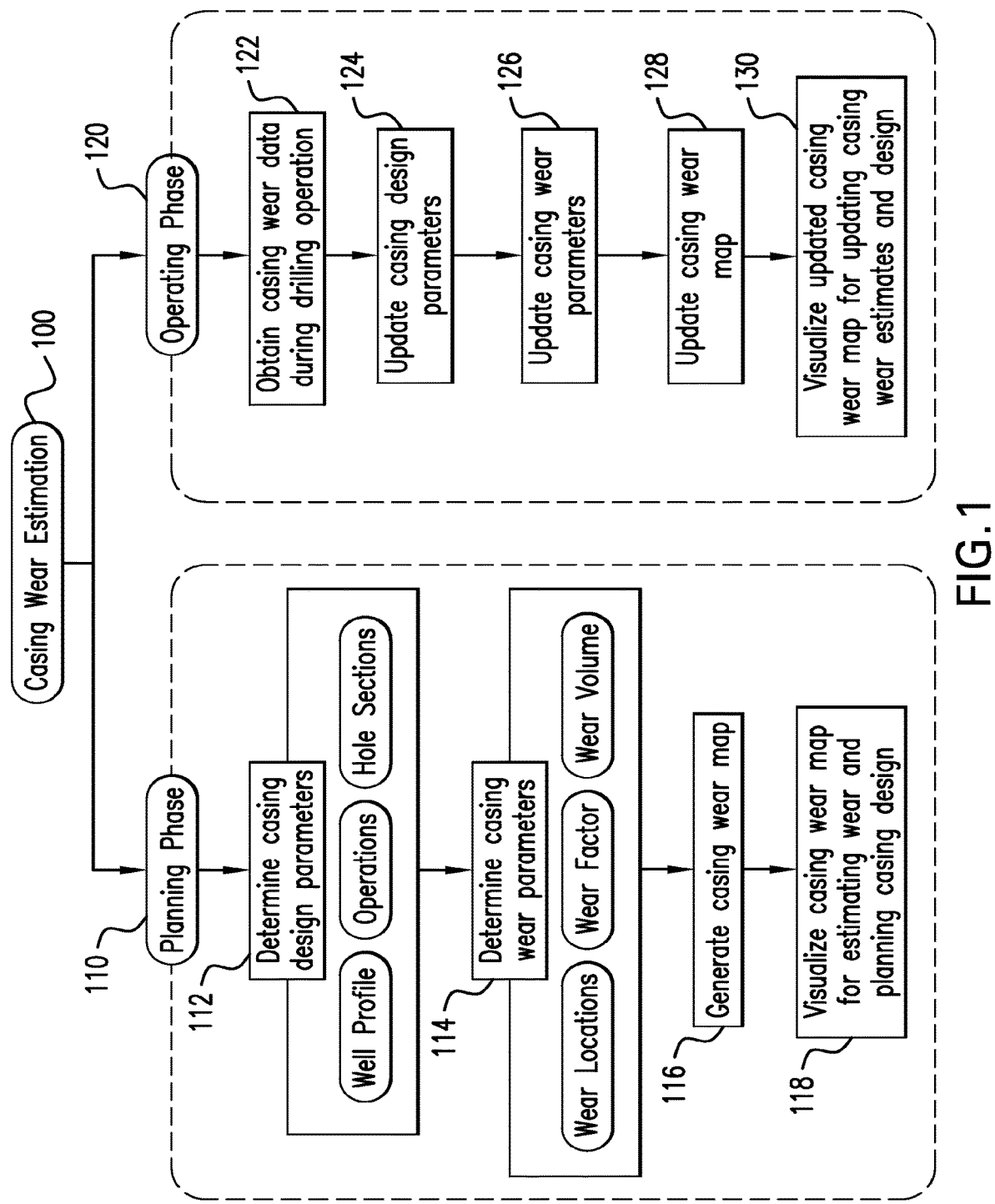
FIG. 1 is a flow diagram of an exemplary process for using casing wear maps to estimate and monitor casing wear in the planning and operating phases of a drilling operation.

The illustrated figures are only exemplary and are not intended to assert or imply any limitation with regard to the environment, architecture, design, or process in which different embodiments may be implemented.

DESCRIPTION OF ILLUSTRATIVE EMBODIMENTS

Embodiments of the present disclosure relate to providing graphical visualizations of casing wear maps for estimating and monitoring casing wear during different phases of a drilling operation. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility. Further, when a particular feature, structure, or characteristic is described in connection with an embodiment, it is submitted that it is within the knowledge of one skilled in the relevant art to effect such feature, structure, or characteristic in connection with other embodiments whether or not explicitly described.

It would also be apparent to one of skill in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

As stated above, conventional casing wear estimation techniques often fail to produce accurate predictions on the actual amount of wear observed downhole in the casing. Accordingly, the disclosed embodiments provide techniques for mapping and visualizing casing wear during different phases of a drilling operation. For example, the casing wear mapping and visualization techniques disclosed herein may enable a user, e.g., a drilling engineer, to better understand the causes of casing wear and develop possible strategies to mitigate their effects during the planning and real-time operating phases of the drilling operation. In an embodiment, a visualization of estimated or actual downhole casing wear may be provided to the user in the form of a casing wear map presented via a display of the user's computing device. The visualized casing wear map may be, for example, a two-dimensional (2D) or three-dimensional (3D) graphical representation of the estimated or actual casing wear relative to one or more drilling parameters or other factors that may affect casing wear over the course of the drilling operation.

In an embodiment, the casing wear map may be visualized as a 2D or 3D graph in which one or more drilling parameters and/or casing wear factors of interest are selected as the axes of the graph. Casing wear factors may be experimentally determined parameters that govern the volume of casing wall being worn out based on, for example, the material property of the casing, drill string tool joints in contact with the wall and the drilling mud being used in operations. For example, contact between parts of the drill string and interior wall of the casing may cause a groove to be formed in the casing wall over the course of the drilling operation. In an embodiment, the depth of such a groove may be determined based on the wear volume associated with the portion of interior casing wall in which the groove is formed. Casing wear factors may also vary based on other drilling parameters like rotary speed and normal loads. The visualized casing wear map in this example may be analyzed and interpreted in different ways to plan for and monitor the casing wear during the entire drilling operation. In a further example, such a casing wear map may be used to monitor the variation of casing wear relative to one or more wear factors, side forces, and wear volume for multiple planned drilling operations simultaneously to help provide even more insight into the causes of wear and ways to mitigate it.

Illustrative embodiments and related methodologies of the present disclosure are described below in reference to FIGS. 1-7 as they might be employed, for example, in a computer system for determining casing design based on the estimated casing wear for different phases of a drilling operation. As used herein, the term "drilling operation" may refer to any of the drilling, completion, and/or production operations conducted at a well site in a petroleum field. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

FIG. 1 is a process flow diagram of an exemplary method 100 for monitoring casing wear using visualized casing wear maps during different phases of a drilling operation. As shown in FIG. 1, method 100 includes steps for estimating casing wear during a planning phase 110 of the drilling operation (i.e., planning a well prior to drilling) and steps for real-time monitoring of the casing wear during an operating phase (or "real-time operations") 120 of the drilling operation (i.e., while the planned well is being drilled). Accordingly, the steps of method 100 provide an example of applying casing wear maps to the overall drilling operation in order to produce a more accurate estimation of casing wear in the planning phase and have a more reliable casing design during real-time operations. Although not shown in FIG. 1, it should be appreciated that method 100 may include additional steps related to well planning and casing design in planning phase 110 and casing wear monitoring in operating phase 120.

In the example shown in FIG. 1, method 100 begins in planning phase 110 and proceeds to step 112, in which casing design parameters for a planned well are determined. It should be noted that the term "casing design parameter" is used herein to refer to a variable property or characteristic of the casing design rather than to a material property or characteristic of the physical casing itself. As shown in FIG. 1, such casing design parameters may include, for example and without limitation, a well profile, hole sections, and operating parameters for the planned well. In an embodiment, the operating parameters may include, but are not limited to, a casing type, a mud type, a rotational speed of a drill string, and one or more types of loads (e.g., lateral loads) expected for the planned well. These casing design parameters may be used, for example, to plan different stages of the operation for drilling the well.

In step 114, the casing design parameters from step 112 may be used to determine various casing wear parameters including, but not limited to, one or more wear factors, wear locations, and wear volume. In an embodiment, wear volume may be a value indicating the amount of estimated casing wear computed for a portion of the planned well based on the casing design parameters. As will be described in further detail below with respect to FIG. 2, such a wear value may be expressed as a percentage representing the amount of wear expected for the casing relative to its thickness along a length of the planned well. The percentage of wear may be determined based on, for example, a depth of the groove that may be formed in the interior wall of the casing due to contact with parts of the drill string. In an embodiment, the groove depth may be determined based on the wear volume computed for a part of the casing wall associated with the relevant portion of the planned well. In step 116, the casing wear parameters may be used to generate a casing wear map. In an embodiment, the generated casing wear map may be a combination of the different casing wear parameters determined in step 114. Accordingly, the casing wear map generated in step 116 may include, for example, a mapping of the wear factor relative to the expected locations and volumes of wear along the length of the planned well.

In step 118, a visualization of the generated casing wear map may be presented on a display of a computing device. The visualized casing wear map may indicate, for example, a variation of the severity of the estimated casing wear according to the wear volume at different locations along the planned well. The visualization may be used, for example, to provide a user of the computing device with a graphical representation of the estimated and real-time monitored casing wear during the respective planning and operating phases of the drilling operation. For example, the user may use this information during the planning phase to select an appropriate casing design that accounts for the casing wear indicated by the visualized map and therefore mitigates the chances of casing failure due to wear. It should be appreciated that any of various techniques may be used to determine a suitable casing design based on the estimated wear and related information provided in the casing wear map. As will be described in further detail below using the examples shown in FIGS. 2-6, different types of casing wear maps may be provided to the user for this purpose.

Figure 2:
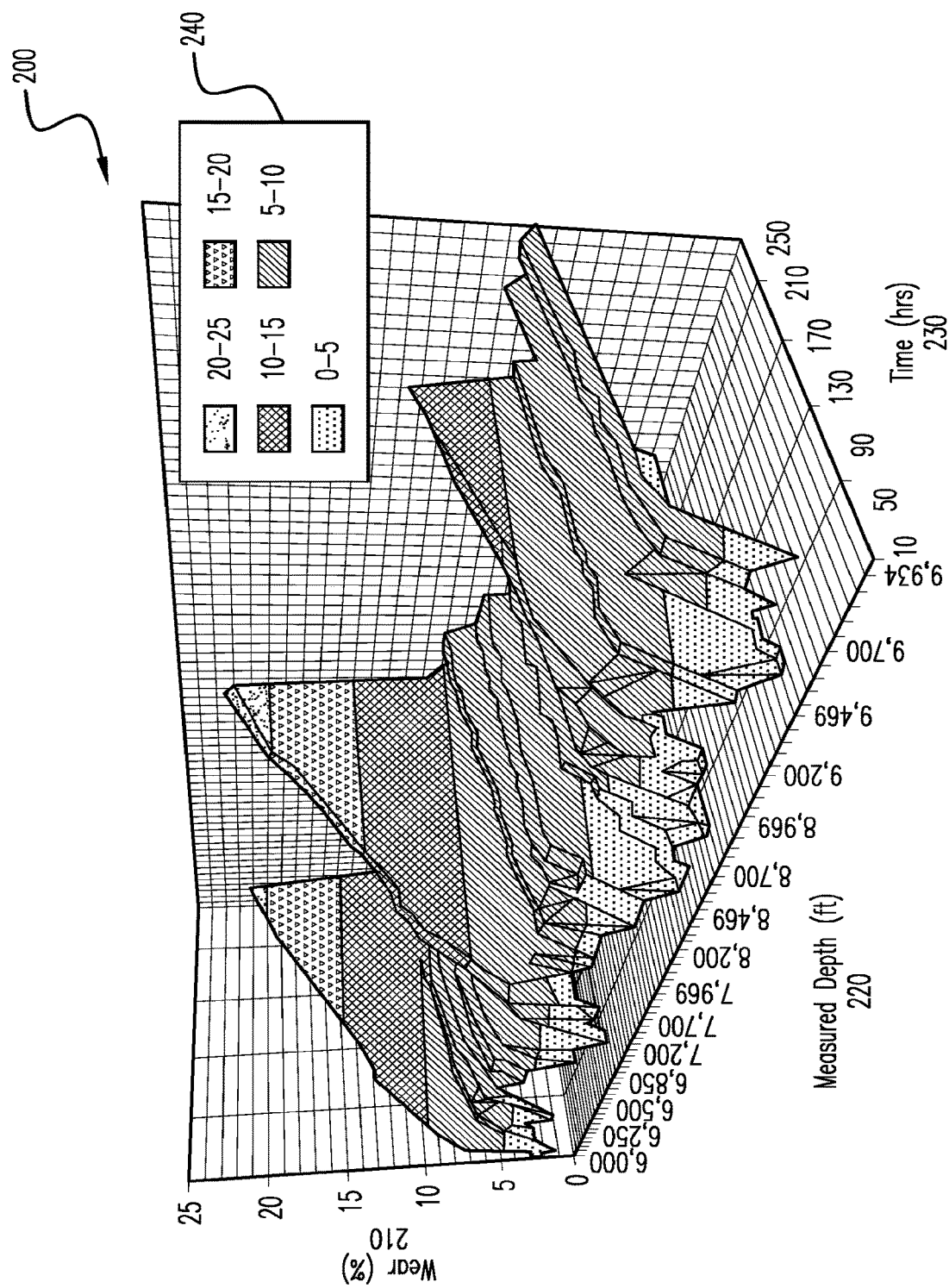
FIG. 2 is an exemplary three-dimensional (3D) casing wear map that shows a variation of casing wear estimated for different depths of a well over a period of time.

FIG. 2 is an exemplary three-dimensional (3D) graphical representation of a casing wear map 200 that shows a variation of casing wear estimated for different depths of a well over a period of time. Casing wear map 200 illustrates, for example, a variation of casing wear 210 relative to a measured depth 220 over a period of operating time 230 planned for the well. Casing wear 210 may represent, for example, the amount of expected wear on the interior wall of the casing, shown as a percentage of casing wall thickness. The values of measured depth 220 may represent, for example, a part of the well profile determined (e.g., in step 112 of FIG. 1) for a planned well. As shown in FIG. 2, casing wear map 200 may be visualized as a 3D graph with measured depth 220, casing wear 210, and operating time 230 corresponding to the three axes of the 3D graph. A visualization of casing wear map 200 may be used, for example, to identify locations of excessive casing wear along the planned well and the planned operations that may have the most detrimental effects. Steps to mitigate wear can then be planned accordingly.

Figure 3:
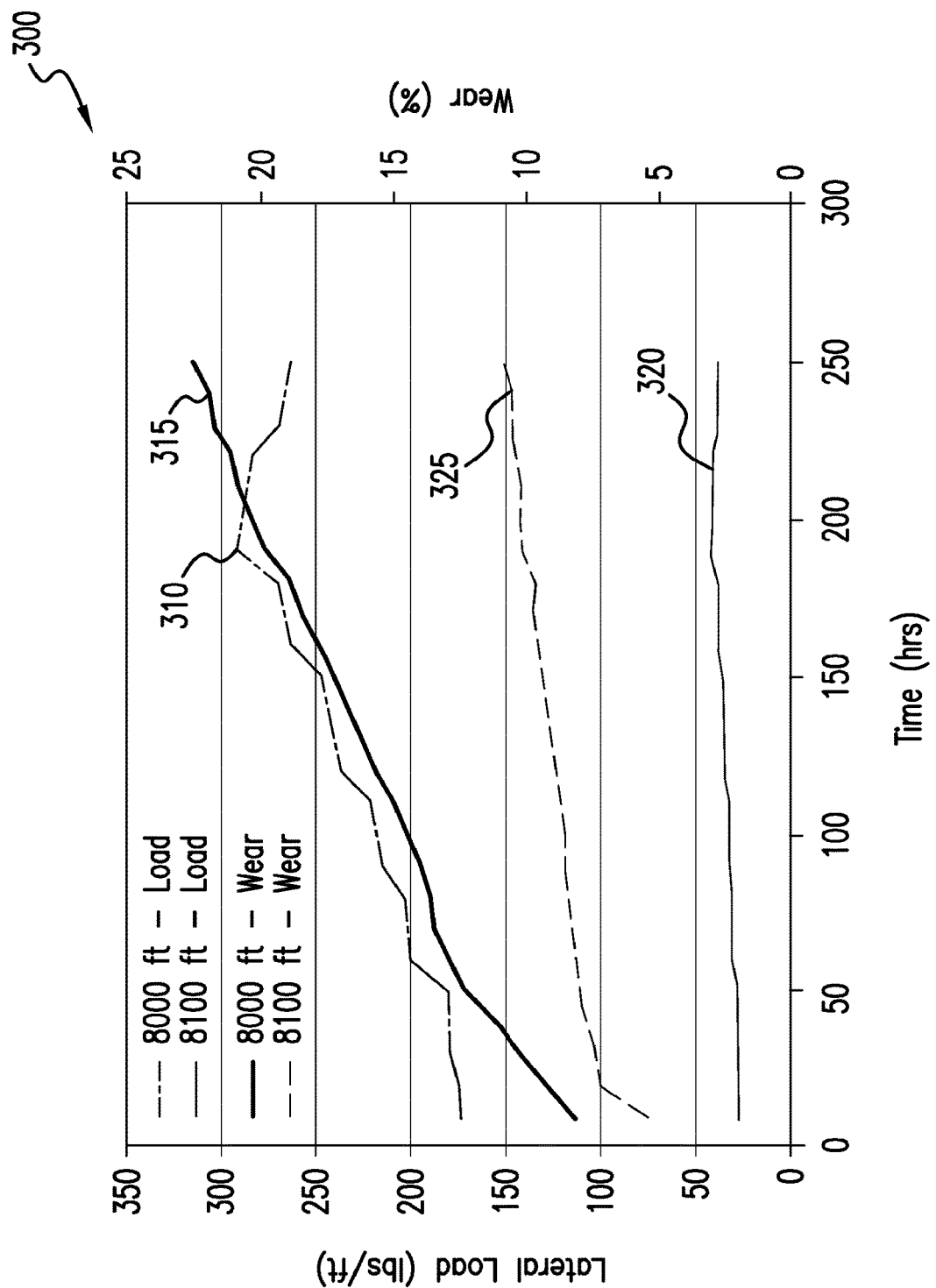
FIG. 3 is a two-dimensional (2D) casing wear map showing the variation of lateral loads and casing wear estimated for two selected depths of the well over time.

As will be described using the example shown in FIG. 3, the next level of visualization and planning may be for the depths of excessive wear. FIG. 3 is a two-dimensional (2D) casing wear map 300 showing the variation of lateral loads and casing wear estimated for two selected depths of the well over time. The selected depths in this example include a first depth of 8,000 ft. and a second depth of 8,100 ft. Thus, as shown in FIG. 3, casing wear map 300 depicts a load 310 and a corresponding wear 315 at 8,000 ft. in addition to a load 320 and a wear 325 at 8,100 ft. These two depths may have been selected based on, for example, the casing wear information provided by casing wear map 200 of FIG. 2. For example, the selected depths may be specified by a user of the computing device based on the visualization of casing wear map 200 presented to the user via a display of the computing device, as described above. Casing wear map 300 in this example may be used to present the user with information relating to the variation of the lateral loads and wear for the planned well.

As shown in FIG. 3, casing wear map 300 may be visualized as a 2D graph that illustrates side force or loading on one axis and the planned operation time on the other axis. A third axis may be used to show the expected casing wear for the planned well at various depths. The information presented by casing wear map 300 may be used, for example, to determine whether the amount of side force or loading should be changed, e.g., by varying the planned operation or the drill string properties, so as to keep the expected casing wear within a tolerable range.

Figure 4:
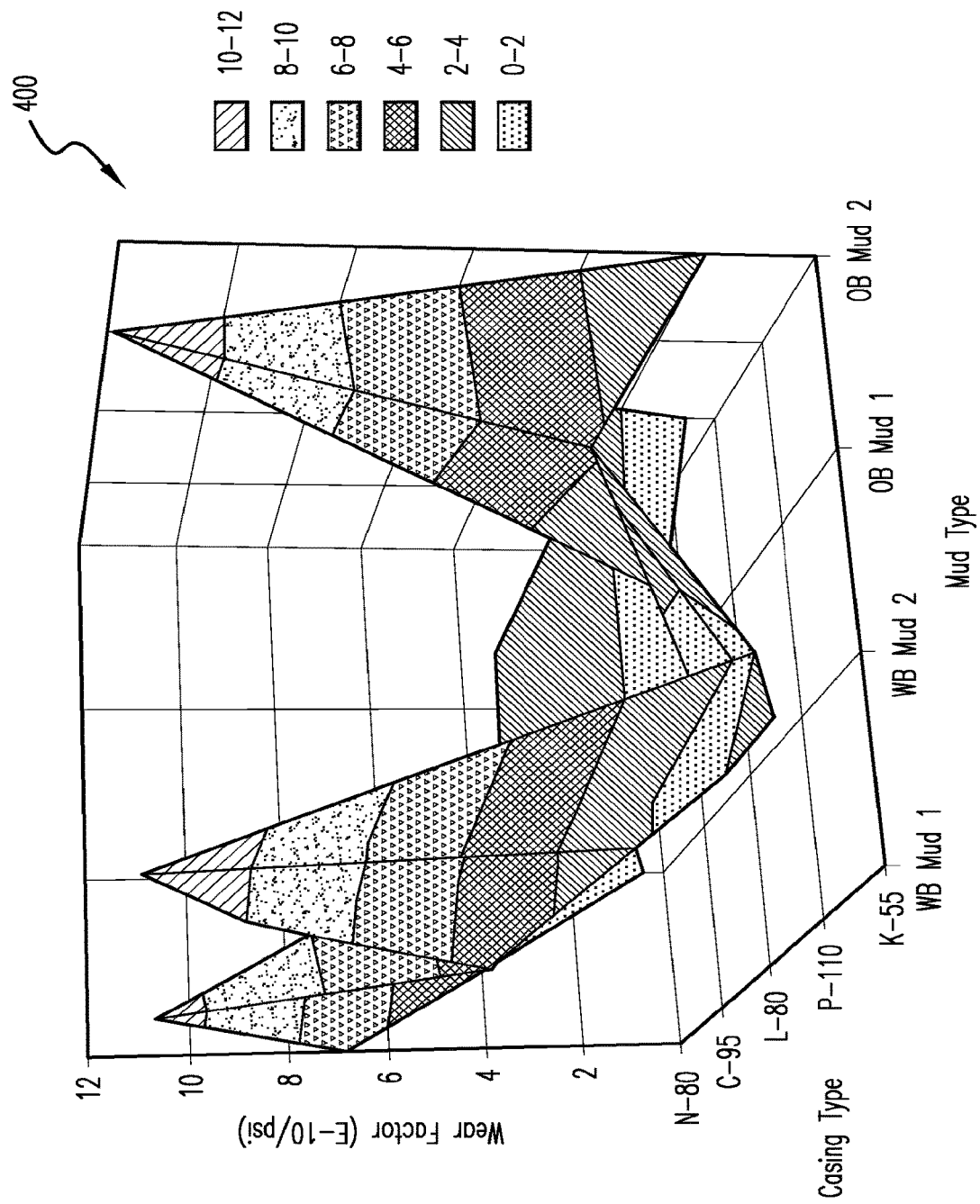
FIG. 4 is an exemplary 3D casing wear map showing the variation of wear factors for different casing types and mud types.
Figure 5:
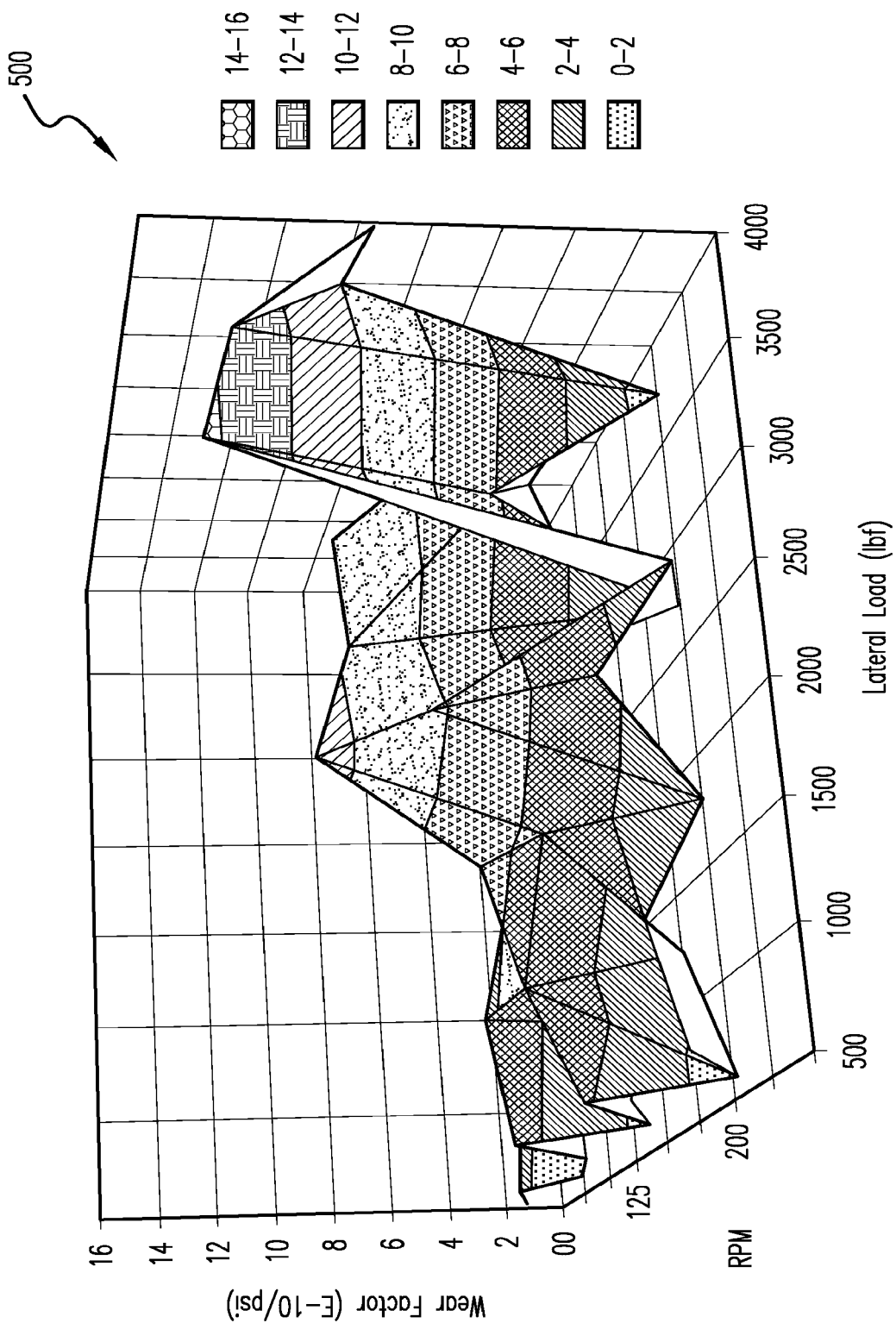
FIG. 5 is another exemplary 3D casing wear map showing the variation of wear factors based on varying rotational speeds of the drill string and lateral loads.

As described above, one or more wear factor(s) based on various underlying parameters affecting casing design may be used in different calculations of casing wear. In an embodiment, the wear factors may vary at any given casing depth based on time and other operating parameters, e.g., type of casing, mud type, rotational speed of the drill string and lateral loads, associated with the planned well. In an embodiment, the expected casing wear factor may be mapped relative to one or more of these operating parameters, as shown in FIGS. 4 and 5. FIG. 4 shows an example of a 3D casing wear map 400, in which the variation of wear factors is mapped relative to different types of casing and different mud types. In FIG. 5, a 3D casing wear map 500 shows the variation of wear factors based on varying rotational speeds of the drill string and lateral loads. It should be noted that the data in each of casing wear maps 400 and 500 is shown for demonstration and discussion purposes only and may not be representative of any actual casing wear data. Actual data points may be determined through experimentation or by using any of various wear factor estimation techniques. The wear mapping technique disclosed herein may then be used to depict wear severity for any drilling operation based on the casing wear data obtained for that particular operation.

Figure 6:
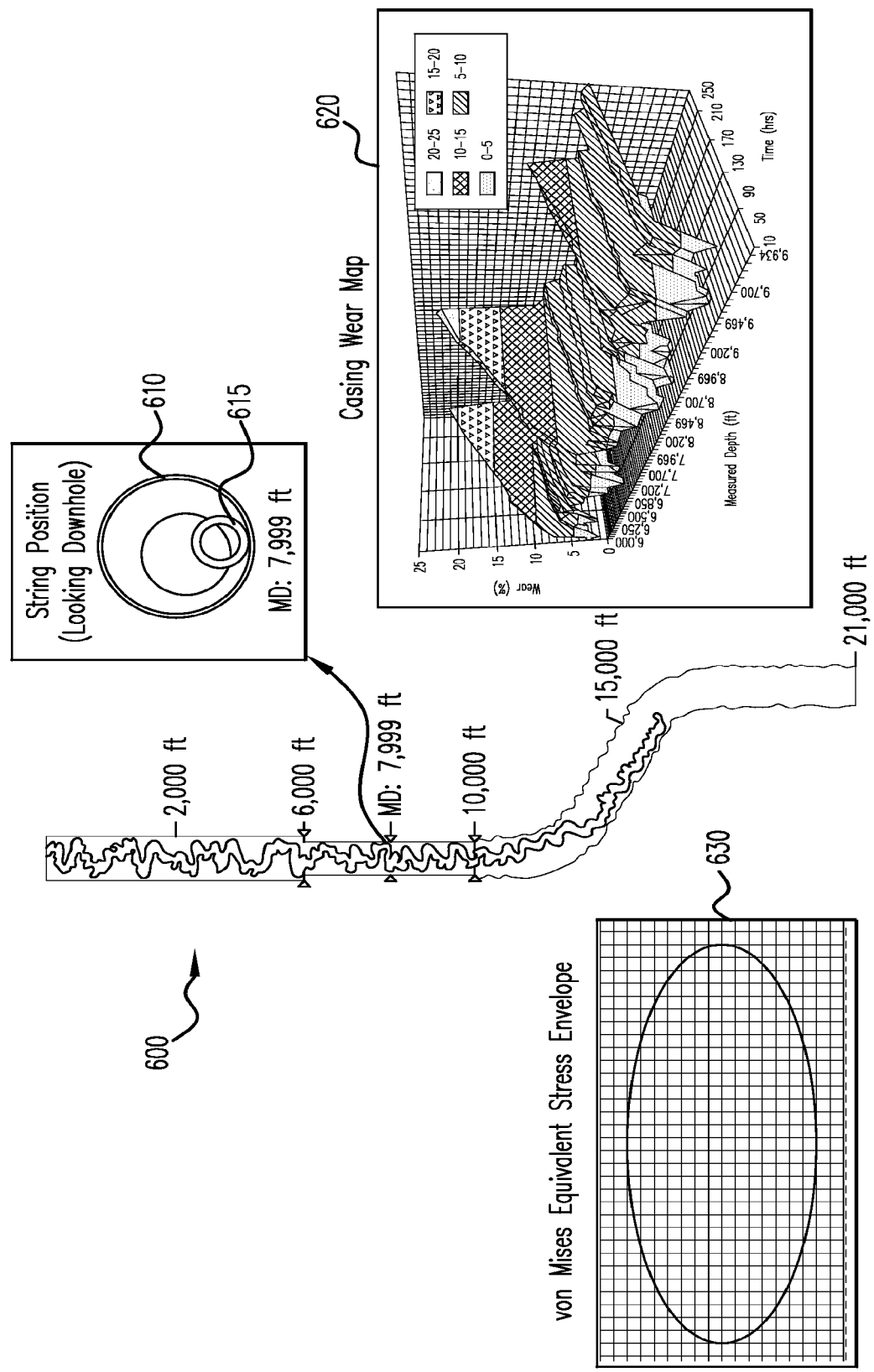
FIG. 6 illustrates an exemplary von Mises equivalent stress envelope for an intermediate casing string design for a planned well profile.

FIG. 6 shows a casing wear map 620 and a von Mises equivalent stress envelope 630 for an intermediate casing string 610 for a planned well profile 600. As before, the data points shown in FIG. 6 are shown for demonstration and discussion purposes only. The visualization depicted in the example of FIG. 6 may help to monitor casing wear and all its underlying aspects simultaneously. The well profile and operations coupled with casing wear maps and casing stress analysis may serve, for example, as a comprehensive casing wear monitoring tool, both during the panning and real-time operations.

In some embodiments, other mapping methods may be applied using field data. Actual field measured casing wear values can be plotted against side loading and operating time for a particular well. This map may then be directly applied to other wells using readings from the map for the same operating parameters. This may serve as a way to bypass wear factors. The variables on each axis can be varied as desired for any of the maps for analysis. The variables may be chosen as shown in the figures or they can also be a combination of any of them. For example, side force multiplied tool joint diameter and drilling rotation speed (RPM) may be mapped against the total operating time.

Referring back to FIG. 1, the casing map visualized in step 118 of method 100 may be similar to any of the casing wear maps described above with respect to FIGS. 2-6. In an embodiment, the visualized casing wear map may be used to identify potential areas of weakness or failure points located along the planned well where the estimated casing wear may be excessive, e.g., above a predetermined wear threshold or tolerance. Once such locations of excessive wear have been identified using the visualized casing wear map, remedial measures can be undertaken to mitigate the risk of casing failure, e.g., by updating the selected casing design for the planned well in order to keep the estimated casing wear within acceptable tolerance limits for the entire drilling operation. It should be appreciated that any of various techniques may be used to account for any uncertainties in the underlying parameters or wear factors used to estimate casing wear in planning phase 110 as well as for any additional casing wear that may occur during non-productive stages of the drilling operation.

As shown in FIG. 1, method 100 may then proceed to the operating phase 120 of the drilling operation as the planned well is drilled. In an embodiment, the planned well may be drilled in multiple stages. While the well is being drilled, data relating to the actual casing wear occurring at each stage of the drilling process may be obtained in step 122. In step 124, the casing design parameters, e.g., the planned well profile, hole section and operating parameters, determined previously in step 112 of planning phase 110 may be updated on a periodic basis or in response to changing field conditions detected over the course of the drilling operation. The updated casing design parameters may then be used to update the casing wear parameters in 126. In an embodiment, step 126 may include comparing the above-described wear volume or other wear value (e.g., wear percentage or groove depth) computed in step 114 of planning phase 110 and the casing wear data obtained in step 122 to determine whether there is any deviation between the expected casing wear and the actual casing wear. One or more of the casing wear parameters, such as the wear factor, may be updated based on the comparison so as to minimize any deviation determined between the estimated casing wear and the actual casing wear and thereby, improve the accuracy of the casing wear map to be visualized. The updated casing design and wear parameters may then be supplied as input for updating the casing wear map in step 128. The updated casing wear map may then be visualized in step 130. The visualized casing wear map may be updated and monitored continuously during the real-time operations. In this way, the casing wear map may serve as a casing wear monitoring tool that can help to improve the casing wear estimates determined for later stages of the planned well to be drilled as well as the casing design to be used for the planned well. This may include, for example, planning for any additional wear that may have been unaccounted for previously, e.g., due to an unexpected deviation from the originally planned drilling program.

It should be appreciated that the steps of method 100 may be performed by any type of computing device having at least one processor and a memory for storing instructions that the process may read and execute to perform a plurality of functions for implementing the steps of method 100, as described above. Examples of such a computing device include, but are not limited to, a server, a desktop computer, a laptop computer, a tablet or other handheld computer, a personal digital assistant (PDA), a cellular telephone, a network appliance, a smart phone, a media player, a navigation device, a game console, or a combination of any these computing devices or other computing devices. In some implementations, method 100 may be performed by a distributed-computing environment or server farm in which the steps of method 100 may be performed by multiple processing devices with shared or separate memory components that are linked through a communications network. In such a distributed-computing environment, program modules may be located in both local and remote computer-storage media including memory storage devices. The present disclosure therefore may be implemented using various hardware devices, software, or a combination thereof. An example of a computer system for implementing the disclosed embodiments is shown in FIG. 7.

Figure 7:
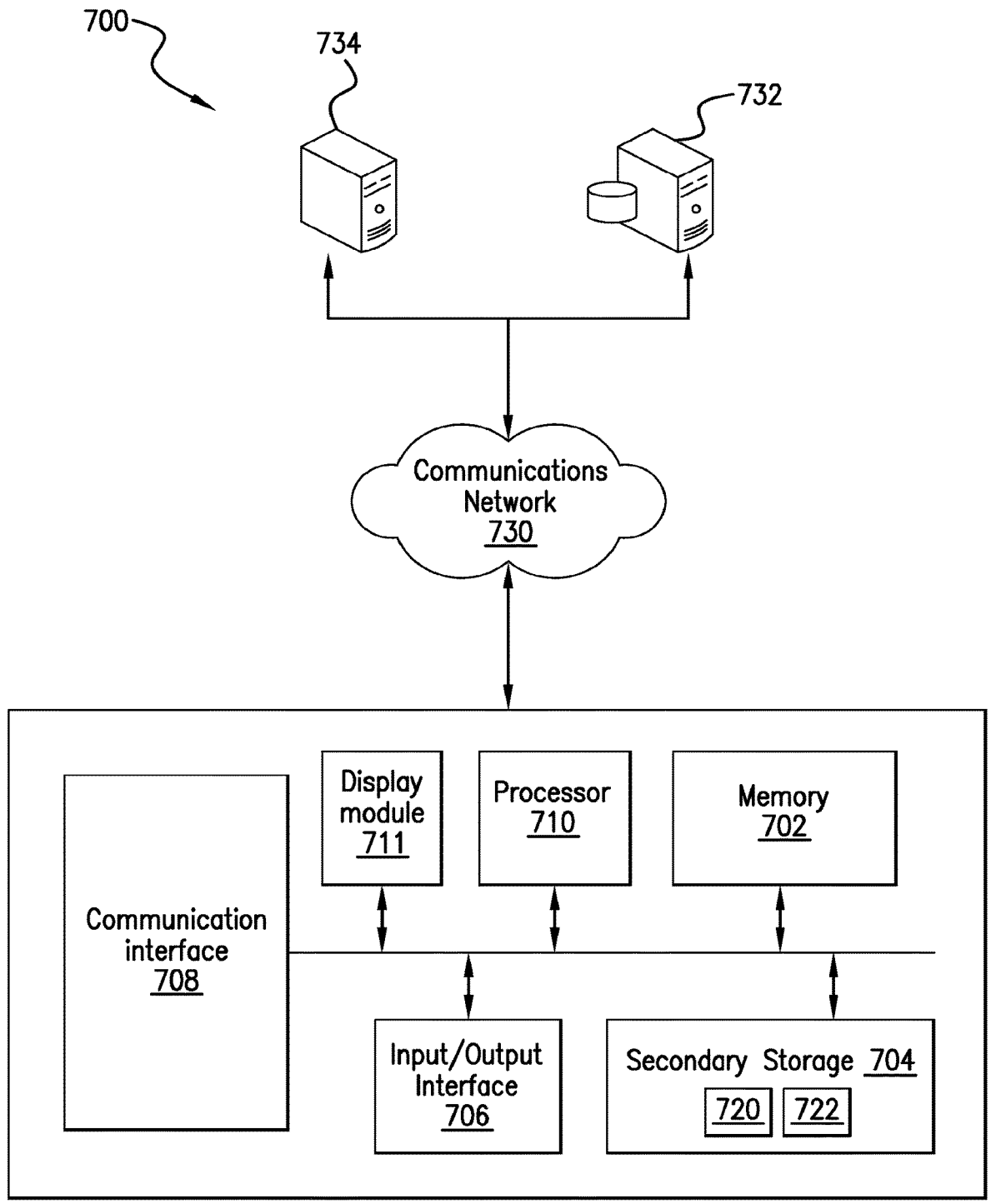
FIG. 7 is a block diagram of an exemplary computer system in which embodiments of the present disclosure may be implemented.

Referring now to FIG. 7, a block diagram illustrating one embodiment of a system 700 for implementing the features and functions of the disclosed embodiments is presented. The system 700 may be any type of computing device including, but not limited to, a desktop computer, a laptop, a server, a tablet, and a mobile device. The system 700 includes, among other components, a processor 710, main memory 702, secondary storage unit 704, an input/output interface 706, and a communication interface 708.

The processor 710 may be any type or any number of single core or multi-core processors capable of executing instructions for performing the features and functions of the disclosed embodiments. The input/output interface 706 enables the system 700 to receive user input (e.g., from a keyboard and mouse) and output information to one or more devices such as, but not limited to, printers, external data storage devices, and audio speakers. The system 700 may optionally include a separate display interface 711 to enable information to be displayed on an integrated or external display device. For instance, the display interface 711 may include instructions or hardware (e.g., a graphics card or chip) for providing enhanced graphics, touchscreen, and/or multi-touch functionalities associated with one or more display devices.

Main memory 702 is volatile memory that stores currently executing instructions/data or instructions/data that are prefetched for execution. The secondary storage unit 704 is non-volatile memory for storing persistent data. The secondary storage unit 704 may be or include any type of data storage component such as a hard drive, a flash drive, or a memory card. In one embodiment, the secondary storage unit 704 stores the computer executable code/instructions and other relevant data for enabling a user to perform the features and functions of the disclosed embodiments.

For example, in accordance with the disclosed embodiments, the secondary storage unit 704 may permanently store executable code/instructions 720 for performing the above-described procedure for minimizing casing wear. The executable code/instructions 720 are then loaded from the secondary storage unit 704 to main memory 702 during execution by the processor 710 for performing the disclosed embodiments. In addition, the secondary storage unit 704 may store other executable code/instructions and data 722 such as, but not limited to, a reservoir simulation application (e.g., Nexus® reservoir simulation software) or Earth modeling software (e.g., DecisionSpace® Earth Modeling software) for use with the disclosed embodiments.

The communication interface 708 enables the system 700 to communicate with the communications network 730. For example, the network interface 708 may include a network interface card and/or a wireless transceiver for enabling the system 700 to send and receive data through the communications network 730 and/or directly with other devices.

The communications network 730 may be any type of network including a combination of one or more of the following networks: a wide area network, a local area network, one or more private networks, the Internet, a telephone network such as the public switched telephone network (PSTN), one or more cellular networks, and/or wireless data networks. The communications network 730 may include a plurality of network nodes (not depicted) such as routers, network access points/gateways, switches, DNS servers, proxy servers, and other network nodes for assisting in routing of data/communications between devices.

For example, in one embodiment, the system 700 may interact with one or more servers 734 or databases 732 for performing the features of the disclosed embodiments. For instance, the system 700 may query the database 732 for all the wear factors in generating wear factor maps in accordance with the disclosed embodiments. Further, in certain embodiments, the system 700 may act as a server system for one or more client devices or a peer system for peer to peer communications or parallel processing with one or more devices/computing systems (e.g., clusters, grids).

While specific details about the above embodiments have been described, the above hardware and software descriptions are intended merely as example embodiments and are not intended to limit the structure or implementation of the disclosed embodiments. For instance, although many other internal components of the control system 100 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures and as described herein. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware- based systems that perform the specified functions or acts, or combinations of special purpose hardware and computer instructions.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the exemplary methodologies described herein may be implemented by a system including processing circuitry or a computer program product including instructions which, when executed by at least one processor, causes the processor to perform any of the methodology described herein.

Advantages and distinguishing features of the disclosed embodiments over conventional techniques include, but are not limited to, applying casing wear maps to the planning and operating stages of a drilling operation through visualization of a varying wear value (e.g., wear volume, wear percentage, or groove depth) mapped to one or more drilling parameters. As described above, 2D and/or 3D casing wear maps may be utilized to estimate casing wear for planning a new casing design or updating an existing design by monitoring actual casing wear for different stages of the drilling operations. The 2D and 3D casing wear mapping and visualization techniques disclosed herein may enable a drilling engineer to better understand the causes of casing wear and develop possible strategies to mitigate their effects, e.g., by accounting for the variation of wear value based on a plurality of drilling parameters including, but not limited to, an operating time, the type of casing, mud type, rotational speed of the drill string, and lateral loads. Moreover, the disclosed techniques may be used to provide a user-friendly casing wear visualization tool for monitoring casing wear during the planning and real-time operating phases of the drilling operation.

As described above, embodiments of the present disclosure are particularly useful for monitoring casing wear for a well during a drilling operation. In one embodiment of the present disclosure, a computer-implemented method for monitoring casing wear for a well during a drilling operation includes: determining casing design parameters for a planned well during a planning phase of the drilling operation; computing a value indicating an amount of casing wear along a length of the planned well, based on the casing design parameters; generating a casing wear map based on the computed wear value along the length of the planned well relative to one or more of the casing design parameters; and visualizing the generated casing wear map via a display of a computing device, the visualized casing wear map enabling a user of the computing device to analyze the estimated casing wear for the planned well and determine an appropriate casing design for the planned well based on the analysis.

In a further embodiment, the method further comprises obtaining data related to actual casing wear determined for a portion of the planned well being drilled during an operating phase of the drilling operation, comparing the computed wear value and the obtained data for the portion of the planned well to determine a deviation between the estimated casing wear and the actual casing wear, and updating the casing wear map based on the comparison so as to minimize the deviation determined between the estimated casing wear and the actual casing wear. In yet a further embodiment, the casing design parameters include a well profile, hole section, and operating parameters associated with the planned well. In yet a further embodiment, the operating parameters include an operating time, a casing type, a mud type, a rotational speed of a drill string, and one or more types of loads. In yet a further embodiment, the generated casing wear map includes a mapping of the computed wear value along the length of the planned well relative to one or more of the operating parameters, and the computed wear value is at least one of a wear volume, a wear percentage, or a groove depth. In yet a further embodiment, the visualized casing wear map is displayed as a graphical representation of the estimated and actual casing wear associated with different portions of the planned well during the respective planning and operating phases of the drilling operation. In an embodiment, the graphical representation is a two-dimensional graphical representation of the casing wear map. In another embodiment, the graphical representation is a three-dimensional graphical representation of the casing wear map.

In another embodiment of the present disclosure, a system for monitoring casing wear for a well during a drilling operation includes at least one processor, a display interface coupled to the processor for displaying information on a display device, and a memory coupled to the processor having instructions stored therein, which when executed by the processor, cause the processor to perform functions, including functions to: determine casing design parameters for a planned well during a planning phase of the drilling operation; compute a wear value indicating an amount of estimated casing wear along a length of the planned well, based on the casing design parameters; generate a casing wear map based on the computed wear value along the length of the planned well relative to one or more of the casing design parameters; and visualize the generated casing wear map on the display device via the display interface, the visualized casing wear map enabling a user of the computing device to analyze the estimated casing wear for the planned well and determine an appropriate casing design for the planned well based on the analysis.

In yet another embodiment of the present disclosure, a computer-readable storage medium has instructions stored therein, which when executed by a computer cause the computer to perform a plurality of functions, including functions to: determine casing design parameters for a planned well during a planning phase of the drilling operation; compute a wear value indicating an amount of estimated casing wear along a length of the planned well, based on the casing design parameters; generate a casing wear map based on the computed wear value along the length of the planned well relative to one or more of the casing design parameters; and visualize the generated casing wear map on the display device via the display interface, the visualized casing wear map enabling a user of the computing device to analyze the estimated casing wear for the planned well and determine an appropriate casing design for the planned well based on the analysis.

While specific details about the above embodiments have been described, the above hardware and software descriptions are intended merely as example embodiments and are not intended to limit the structure or implementation of the disclosed embodiments. For instance, although many other internal components of the system 700 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modification.

What is claimed is:

1. A computer-implemented method for monitoring casing wear for a well during a drilling operation, the method comprising:
    determining casing design parameters for a planned well during a planning phase of the drilling operation;
    computing a wear value indicating an amount of estimated casing wear along a length of the planned well, based on the casing design parameters;

generating a three-dimensional (3D) casing wear map of the computed wear value along the length of the planned well relative to one or more of the casing design parameters; and visualizing the generated 3D casing wear map via a display of a computing device, the visualized 3D casing wear map enabling a user of the computing device to analyze the estimated casing wear for the planned well and determine an appropriate casing design for the planned well based on the analysis.

2. The method of claim 1, further comprising:

obtaining data related to actual casing wear determined for a portion of the planned well being drilled during an operating phase of the drilling operation;

comparing the computed wear value and the obtained data for the portion of the planned well to determine a deviation between the estimated casing wear and the actual casing wear;

updating the wear value so as to minimize the deviation determined between the estimated casing wear and the actual casing wear; and regenerating the 3D casing wear map based on the updated wear value.

3. The method of claim 1, wherein the casing design parameters include a well profile, hole section, and operating parameters associated with the planned well.

4. The method of claim 3, wherein the operating parameters include an operating time, a casing type, a mud type, a rotational speed of a drill string, and one or more types of loads.

5. The method of claim 4, wherein the generated 3D casing wear map includes a mapping of the computed wear value along the length of the planned well relative to one or more of the operating parameters, and the computed wear value is at least one of a wear volume, a wear percentage, or a groove depth.

6. The method of claim 1, wherein the visualized 3D casing wear map is displayed as a graphical representation of the estimated and actual casing wear associated with different portions of the planned well during the respective planning and operating phases of the drilling operation.

7. The method of claim 1, further comprising determining one or more wear factors from the casing design parameters, the one or more wear factors governing the volume of casing wall removed during the drilling operation.

8. The method of claim 7, wherein the one or more wear factors vary at any given length of the planned well based on the casing design parameters.

9. The method of claim 8, wherein the 3D casing wear map provides a three-dimensional mapping of the variation between the one or more wear factors relative to the one or more casing design parameters.

10. The method of claim 1, wherein at least one of the one or more of the casing design parameters is selected as an axis of the 3D casing wear map.

11. A system for monitoring casing wear for a well during a drilling operation, the system comprising:

at least one processor;

a display interface coupled to the processor for displaying information on a display device; and a memory coupled to the processor having instructions stored therein, which when executed by the processor, cause the processor to perform a plurality of functions, including functions to:

determine casing design parameters for a planned well during a planning phase of the drilling operation;

compute a wear value indicating an amount of estimated casing wear along a length of the planned well, based on the casing design parameters;

generate a three-dimensional (3D) casing wear map of the computed wear value along the length of the planned well relative to one or more of the casing design parameters; and visualize the generated 3D casing wear map on the display device via the display interface, the visualized 3D casing wear map enabling a user of the computing device to analyze the estimated casing wear for the planned well and determine an appropriate casing design for the planned well based on the analysis.

12. The system of claim 11, wherein the functions performed by the processor further comprise functions to:

obtain data related to actual casing wear determined for a portion of the planned well being drilled during an operating phase of the drilling operation;

compare the computed wear value and the obtained data for the portion of the planned well to determine a deviation between the estimated casing wear and the actual casing wear;

update the wear value so as to minimize the deviation determined between the estimated casing wear and the actual casing wear; and regenerate the 3D casing wear map based on the updated wear value.

13. The system of claim 11, wherein the casing design parameters include a well profile, hole section, and operating parameters associated with the planned well.

14. The system of claim 13, wherein the operating parameters include an operating time, a casing type, a mud type, a rotational speed of a drill string, and one or more types of loads.

15. The system of claim 14, wherein the generated 3D casing wear map includes a mapping of the computed wear value along the length of the planned well relative to one or more of the operating parameters, and the computed wear value is at least one of a wear volume, a wear percentage, or a groove depth.

16. The system of claim 11, wherein the visualized 3D casing wear map is displayed as a graphical representation of the estimated and actual casing wear associated with different portions of the planned well during the respective planning and operating phases of the drilling operation.

17. A computer-readable storage medium having instructions stored therein, which when executed by a computer cause the computer to perform a plurality of functions, including functions to:

determine casing design parameters for a planned well during a planning phase of the drilling operation;

compute a wear value indicating an amount of estimated casing wear along a length of the planned well, based on the casing design parameters;

generate a three-dimensional (3D) casing wear map of the computed wear value along the length of the planned well relative to one or more of the casing design parameters; and visualize the generated 3D casing wear map via a display device, the visualized 3D casing wear map enabling a user of the computing device to analyze the estimated casing wear for the planned well and determine an appropriate casing design for the planned well based on the analysis.

18. The computer-readable storage medium of claim 17, wherein the functions performed by the computer further include functions to:
- obtain data related to actual casing wear determined for a portion of the planned well being drilled during an operating phase of the drilling operation;
- compare the computed wear value and the obtained data for the portion of the planned well to determine a deviation between the estimated casing wear and the actual casing wear;
- update the wear value so as to minimize the deviation determined between the estimated casing wear and the actual casing wear; and
- regenerate the 3D casing wear map based on the updated wear value.

19. The computer-readable storage medium of claim 18, wherein the casing design parameters include a well profile, hole section, and operating parameters associated with the planned well, the operating parameters include an operating time, a casing type, a mud type, a rotational speed of a drill string, and one or more types of loads, the generated 3D casing wear map includes a mapping of the computed wear value along the length of the planned well relative to one or more of the operating parameters, and the computed wear value is at least one of a wear volume, a wear percentage, or a groove depth.

20. The computer-readable storage medium of claim 19, wherein the visualized 3D casing wear map is displayed as a graphical representation of the estimated and actual casing wear associated with different portions of the planned well during the respective planning and operating phases of the drilling operation.

* * * * *